United States Patent
Lee et al.

(10) Patent No.: US 7,026,052 B2
(45) Date of Patent: Apr. 11, 2006

(54) POROUS LOW K(<2.0) THIN FILM DERIVED FROM HOMO-TRANSPORT-POLYMERIZATION

(75) Inventors: Chung J. Lee, Fremont, CA (US); Atul Kumar, Fremont, CA (US)

(73) Assignee: Dielectric Systems, Inc., Fremont, CA (US)

( * ) Notice: Subject to any disclaimer, the term of this patent is extended or adjusted under 35 U.S.C. 154(b) by 40 days.

(21) Appl. No.: 10/265,281

(22) Filed: Oct. 4, 2002

(65) Prior Publication Data

US 2003/0100691 A1    May 29, 2003

Related U.S. Application Data

(63) Continuation-in-part of application No. 10/207,652, filed on Jul. 29, 2002, which is a continuation-in-part of application No. 10/126,919, filed on Apr. 19, 2002, now abandoned, which is a continuation-in-part of application No. 10/125,626, filed on Apr. 18, 2002, which is a continuation-in-part of application No. 10/116,724, filed on Apr. 4, 2002, now Pat. No. 6,881,447, which is a continuation-in-part of application No. 10/115,879, filed on Apr. 4, 2002, now abandoned, which is a continuation-in-part of application No. 10/029,373, filed on Dec. 20, 2001, now abandoned, which is a continuation-in-part of application No. 10/028,198, filed on Dec. 20, 2001, now Pat. No. 6,797,343, which is a continuation-in-part of application No. 09/925,712, filed on Aug. 9, 2001, now Pat. No. 6,703,462, which is a continuation-in-part of application No. 09/795,217, filed on Feb. 26, 2001, now Pat. No. 6,825,303.

(51) Int. Cl.
*B32B 3/00*   (2006.01)
*B32B 27/00*  (2006.01)

(52) U.S. Cl. ............... 428/411.1; 428/421; 428/422; 428/500

(58) Field of Classification Search ............ 428/308.4, 428/411.1, 500, 304.4, 305.5, 421, 422; 526/75, 526/242, 251, 347, 348.1; 264/45.3, 49, 264/317
See application file for complete search history.

(56) References Cited

U.S. PATENT DOCUMENTS

| | | |
|---|---|---|
| 3,268,599 A | 8/1966 | Chow |
| 3,274,267 A | 9/1966 | Chow |
| 3,280,202 A | 10/1966 | Gilch |
| 3,288,728 A | 11/1966 | Gorham |
| 3,332,891 A | 7/1967 | Chow et al. |
| 3,342,754 A | 9/1967 | Gorham et al. |
| 3,349,045 A | 10/1967 | Gilch |
| 3,379,803 A | 4/1968 | Tittmann et al. |
| 3,503,903 A | 3/1970 | Shaw et al. |
| 3,509,075 A | 4/1970 | Niegish et al. |
| 3,626,032 A | 12/1971 | Norris |
| 3,694,495 A | 9/1972 | Norris |
| 3,940,530 A | 2/1976 | Loeb et al. |
| 4,163,828 A * | 8/1979 | Mahoney ............... 428/523 |
| 5,268,202 A | 12/1993 | You et al. |
| 5,538,758 A | 7/1996 | Beach et al. |
| 5,609,629 A * | 3/1997 | Fearnot et al. ........... 623/1.42 |
| 5,879,808 A | 3/1999 | Wary et al. |
| 5,958,510 A | 9/1999 | Sivaramakrishnam |
| 6,130,171 A | 10/2000 | Gomi |
| 6,140,456 A | 10/2000 | Lee et al. |
| 6,265,320 B1 | 7/2001 | Shi et al. |
| 6,331,163 B1 * | 12/2001 | Kaplan ................... 600/486 |

FOREIGN PATENT DOCUMENTS

| | | |
|---|---|---|
| EP | 0 349 032 A2 | 1/1990 |
| EP | 0 523 479 A2 | 1/1993 |
| EP | 0 856 503 A1 | 8/1998 |
| GB | 650 947 | 3/1951 |
| GB | 673 651 | 6/1952 |
| WO | WO 97/15699 | 5/1997 |
| WO | WO-97/15951 | 5/1997 |
| WO | WO 97/42356 | 11/1997 |
| WO | WO-99/21705 | 5/1999 |
| WO | WO-99/21706 | 5/1999 |
| WO | WO-99/21924 | 5/1999 |

| | | |
|---|---|---|
| WO | WO 99/22043 | 5/1999 |

OTHER PUBLICATIONS

U.S. Appl. No. 10/028,198, filed Dec. 19, 2002, Lee.
U.S. Appl. No. 10/029,373, filed Dec. 19, 2002, Lee.
U.S. Appl. No. 10/115,879, filed Apr. 4, 2002, Lee.
U.S. Appl. No. 10/116,724, filed Apr. 4, 2002, Lee.
U.S. Appl. No. 10/125,626, filed, Apr. 17, 2002, Lee.
U.S. Appl. No. 10/126,919, filed Apr. 19, 2002, Lee.
U.S. Appl. No. 10/141,358, filed May 8, 2002, Lee.
U.S. Appl. No. 10/207,652, filed Jul. 29, 2002, Lee.
U.S. Appl. No. 10/243,990, filed, Sep. 13, 2002, Lee.
Brun A.E. 100NM: The Undiscovered Country, Semiconductor International, P79, Feb. 2000.
Chow, S. W., et al., "The synthesis of 1,1,2,2,9,9,10,10-octafluorou2, 2Paracyclophane" Journal of Organic Chemistry, American Chemical Society. Easton, US vol. 35(1), 1970 pp. 20-22.
Chow, S. W., et al., "Poly (a,a,a',a'-tetrafluoro-p-xylylene)," Journal of Applied Polymer Science, New York, NY<US, vol. 13, No. 9, 1969, pp. 2325-2332.
Yang, G.-R. et al., "High Deposition Rate Parylene Films," Journal of Crystal Growth, North-Holland Publishing Co., Amsterdam, NL, vol. 183, No. 3, 1998, pp. 385-390.
Greiner, A, "Poly(1,4-xylylene)s: Polymer Films by Chemical Vapour Deposition," Trends in Polymer Science, Elsevier Science Publishers B. V. Amsterdam, NL, vol. 5, No. 1, 1997, pp. 12-16.
Harrus, A. S., et al., "Parylene Af-4: A Low $e_R$ Material Candidate for ULSI Multilevel Interconnect Applications," Material Research Society Symposium Proceedings, vol. 443, 1997.
Iwamoto, R., et al., "Crystal Structure of Poly-p-xylylene. I. The a Form," Jour. Polymer. Sci. Polymer. Phys. Ed., vol. 11, (1973), pp. 2403-2411.
Iwamoto, R., et al., "Crystallization During Polymerization of Poly-p-xylene. III. Crystal Structure and Molecular Orientation as a Function of Temperature," Jour. Polymer. Sci. Polymer. Phys. Ed., vol. 13, (1975), pp. 1925-1938.
Lang, C-I, "Vapor Deposition of Very low k Polymer Films, Poly (Naphthalene), Poly (Fluorinated Naphthalene)" Materials Research Society Symposium Proceedings, Materials Research Society, Pittsburgh, PA US, vol. 381, Apr. 17, 1995, pp. 45-50.
Lee C.J. "Polyimides, polyquinolines and polyquinoxalines: Tg-Structure Relationships" Macromol. Chem. Phys. C29 (4) 431-560 (1989).
Lee, C, "Transport Polymerization of Gaseous Intermediates and Polymer Crystals Growth", *J. Macromol. Sci-Rev, Macromol. Chem.*, C16(1), 79-127 (1977-78), pp79-127).
Mathur, D., et al., "Vapor Deposition of Parylene-F Using Hydrogen as Carrier Gas," Journal of Materials Research, vol. 14, No. 1, 1999, pp. 246-250.
Morgen, M., et al., "Morphological Transitions in Fluorinated and Non-Fluorinated Parylenes," Material Research Society Symposium Proceedings, vol. 565, 1999, pp. 297-302.
Peng Z., and McGivern, Sean., "Quantum Yields and Energy Partitioning in the UV Photodissociation of Halon 2402)", Jour. of Chem.Phys. vol 113, No. 17, p7149-7157 (2000).
Plano, M. A., et al., "The Effect of Deposition Conditions of the Properties of Vapor-Deposited Parylene AF-4 Films," Material Research Society Symposium Proceedings, vol. 476, 1997, pp. 213-218.
Rashed, A.H., "Properties and characteristics of Silicon Carbide." a website publication (www.poco.com), POCO Graphite Inc. 300 old Greenwood Rd., Decatur, TX 76234.
Riedel, W., "Electro-Less Nickel Plating 2$^{nd}$ Edition", ASM International, Finishing Publication LTD. 1998.
Ryan, E. T., et al., "Effect of Deposition and Annealing on the Thermomechanical Properties of Parylene Films," Material Research Society Symposium Proceedings, vol. 476, 1997, pp. 225-230.
Sharma, A. K., et al., "Optimizing Poly(chloro-p-Xylylene) or Parylene C Synthesis," Journal of Applied Science, John Wiley and Sons, Inc., New York, US, vol. 36, No. 7, Sep. 20, 1988, pp. 1555-1565.
Wary J, et al., Polymer Developed to be Interlayer Dielectric, Semi-Conductor International, 211-216, Jun. 1996.

\* cited by examiner

*Primary Examiner*—Ramsey Zacharia
(74) *Attorney, Agent, or Firm*—Alleman Hall McCoy Russell & Tuttle LLP

(57) ABSTRACT

The present invention pertains to a processing method to produce a porous polymer film that consists of sp$^2$C—X and HC-sp$^3$C$_\alpha$—X bonds (wherein, X=H or F), and exhibits at least a crystal melting temperature, ("T$_m$"). The porous polymer films produced by this invention are useful for fabricating future integrated circuits ("IC's"). The method described herein is useful for preparing the porous polymer films by polymerizing reactive intermediates, formed from a first-precursor, with a low feed rate and at temperatures equal to or below a melting temperature of intermediate (T$^1_m$). Second-precursors that do not become reactive intermediates or have an incomplete conversion to reactive intermediates are also transported to a deposition chamber and become an inclusion of the deposited film. By utilizing a subsequent in-situ, post treatment process the inclusions in the deposited film can be removed to leave micro-pores in the resultant film. Annealing methods are used herein to stabilize the polymer films after reactive plasma etching. Furthermore, the present invention pertains to employment of reductive plasma conditions for patterning polymer films that consist of sp$^2$C—X and HC-sp$^3$C$_\alpha$—X bonds (wherein, X=H, F).

11 Claims, 1 Drawing Sheet

POROUS LOW K(<2.0) THIN FILM DERIVED FROM HOMO-TRANSPORT-POLYMERIZATION

RELATED APPLICATIONS

This application is a continuation-in-part of the Lee, et al., U.S. patent application Ser. No. 10/207,652, entitled "Porous Low k (≦2.0) Thin Films by Transport Co-polymerization," and filed on Jul. 29, 2002 with Lee, et al., listed as inventors. The Ser. No. 10/207,652 application is a continuation-in-part of the Lee, et al., U.S. patent application Ser. No. 10/126,919, entitled "Process Modules for Transport Polymerization of Low ε Thin Films," and filed on Apr. 19, 2002 now abandoned. The Ser. No. 10/126,919 application is a continuation-in-part of the Lee, et al., U.S. patent application Ser. No. 10/125,626, entitled "Multi-Stage-Heating Thermal Reactor for Transport Polymerization," and filed on Apr. 18, 2002. The Ser. No. 10/125,626 application is a continuation-in-part of the Lee, et al., U.S. patent application Ser. No. 10/115,879, entitled "UV Reactor for Transport Polymerization," and filed on Apr. 4, 2002 now abandoned. The Ser. No. 10/115,879 application is a continuation-in-part of the Lee, et al., U.S. patent application Ser. No. 10/116,724, entitled "Chemically and Electrically Stabilized Polymer Films," and filed on Apr. 4, 2002 now U.S. Pat. No. 6,881,447. The Ser. No. 10/116,724 application is a continuation-in-part of the Lee, et al., U.S. patent application Ser. No. 10/029,373, entitled "Dielectric Thin Films from Fluorinated Benzocyclobutane Precursors," and filed on Dec. 20, 2001 now abandoned. The Ser. No. 10/029,373 application is a continuation-in-part of the Lee, et al., U.S. patent application Ser. No. 10/028,198, entitled "Dielectric Thin Films from Fluorinated Precursors," and filed on Dec. 20, 2001 now abandoned. The Ser. No. 10/028,198 application is a continuation-in-part of the Lee, et al., U.S. patent application Ser. No. 09/925,712, entitled "Stabilized Polymer Film and its Manufacture," and filed on Aug. 9, 2001 now U.S. Pat. No. 6,703,462. The Ser. No. 09/925,712 application is a continuation-in-part of the Lee, et al., U.S. patent application Ser. No. 09/795,217, entitled "Integration of Low ε Thin films and Ta into Cu Dual Damascene," and filed on Feb. 26. 2001 now U.S. Pat. No. 6,825,303. The entirety of each of the applications or patents listed above is hereby specifically incorporated by reference.

BACKGROUND

The present invention relates to preparation methods for making porous polymer dielectric film that is useful in the manufacturing of future integrated circuits ("IC's"). In particular, the present invention relates to preparation methods for making a porous polymer film from a distinct precursor, or homo-transport polymerization ("HTP"). Thus, HTP avoids the need of using a dissimilar precursor, which was utilized in U.S. patent application Ser. No. 10/207,652 ("the '652 application"), entitled "Porous Low k (≦2.0) Thin Films by Transport Co-polymerization," and filed on Jul. 29, 2002 with Lee, et al., listed as inventors. The current invention discloses methods to maximize a dielectric's physical properties (e.g. Young's Modulus). Additionally, the post treatment methods of this invention can be used to retain the chemical integrity on the dielectric film surface after exposure to a chemical process (e.g. reactive plasma etching). The post-treatment methods disclosed herein assure good adhesion and film integrity to a subsequent top layer film.

Although not wanting to be bound by theory, multiple layers of films are deposited during the manufacture of an IC, and maintaining the compatibility and structural integrity of the different layers throughout the various processes involved in finishing the IC is important. In addition to a dielectric layer and conducting layer, a "barrier layer" is also included. The "barrier layer" may include metals, metal nitrides, and silicides (e.g. Ti, Ta, W, Co, TiN, TaN, TaSixNy, TiSixNy, WNx, CoNx and CoSiNx). Ta is currently the most useful barrier layer material for the fabrication of future IC's that use copper as conductor. The "cap layer or etch stop layer" normally consists of dielectric materials such as SiC, SiN, SiON, silicon oxide ("SiyOx"), fluorinated silicon oxide ("FSG"), SiCOH, and SiCH.

The schematic in FIG. 1 is used to illustrate some fundamental processes involved for fabrication of a single Damascene structure and future IC's. During fabrication of future ICs, for instance, first a dielectric 110 is deposited on wafer using a Spin-On or Chemical Vapor Deposition ("CVD") dielectric. A photoresist is then spun onto the substrate and patterned using a photo mask and UV irradiation. After removal of the unexposed photoresist, a protective pattern of cured photoresist is formed over the underlying dielectric. A via in the dielectric layer is then created by plasma etching of the dielectric that is not protected by the photoresist. A thin layer (50 to 200 Å) of barrier metal 130, such as Ta, then can be deposited using physical vapor deposition ("PVD") method. This is followed by deposition of a very thin (50 to 100 Å) layer of copper seed 150 using PVD or Metal-Organic CVD ("MOCVD"). Following deposition of the barrier or seed layers, the via is filled with copper 140 using an Electro-Chemical Plating ("ECP") method. Chemical Mechanical Polishing ("CMP") may be needed to level the surface of the Damascene structure. Optionally, a cap-layer can be deposited over the dielectric before coating of photoresist and photolithographic patterning of the dielectric. The cap-layer can be used to protect the dielectric from mechnical damage during CMP.

Currently, there are two groups of low ε dielectric materials, (a) a traditional inorganic group, and (b) a newer organic polymer group. The traditional inorganic group is exemplified by $SiO_2$, fluorine doped $SiO_2$ products, as well as C and H doped products of $SiO_2$. Commercial fluorine doped $SiO_2$ products are exemplified by FSG. The C and H doped $SiO_2$ products (e.g. $SiO_xC_yH_z$) are exemplified by Black Diamond (available from Applied Materials Inc.), and Coral (available from Novellus Inc.), respectively. The newer organic polymers are exemplified by SiLK, which is available from Dow Chemical Company. Unfortunately, none of the dielectric materials that are used in the mass manufacturing of current-IC's can be used for the mass production of future-IC's because they are inadequate for the physical demands required. For example, the inorganic group and organic polymer group materials mentioned above are inadequate for their continued use as dielectrics in future-IC production because they have high dielectric constants (ε≧2.7), low yield (<5–7%), and marginal rigidity (Young's Modulus is less than 3.8 GPa). In contrast, the low k (<2.0) thin porous film of this invention has a low dielectric constant of equal or less than 2.0, a Young's Modulus of at lest 5 GPa, and pore sizes of less than 30 Å, which makes the invention described herein useful for fabrication of 0.065 to 0.045 μm IC's.

SUMMARY

A primary aspect of this invention is to provide compositions and methods for making low k (<2.0) porous film from a distinct precursor or homo-transport polymerization ("HTP"). This method can avoid the need of using dissimilar precursors, as used in the method of co-polymerization. Additionally, a porous dielectric film with small pore size and narrow pore size distribution is achieved using the method described in this invention. Furthermore, a dielectric film with high crystallinity and Young's Modulus with both chemical and electrical stability is also achieved with the method described for this invention. The dielectric film of this invention is suitable for fabrication of IC's using the Cu Dual Damascene process.

Accordingly, a first aspect of the current invention is a dielectric thin film prepared by homo-transport polymerization ("HTP") of radical intermediates formed from a first-precursor, in the presence of an un-reacted compound (i.e. second-precursor), wherein the un-reacted compound is incorporated in the dielectric thin film. The HTP of radical intermediates occurs inside a deposition chamber with a gas composition comprising the un-reacted precursor (i.e. second-precursor) in a concentration range of 0.001 to 25 molar percent. The HPT of radical intermediates is generally performed under a HPT-atmosphere, and the HTP-atmosphere comprises a vacuum with a low system leakage rate, an inert atmosphere, or both. The dielectric thin film of this invention also comprises a general class of polymers called poly(para-xylylene) ("PPX") having various repeating units of ($-CX^1X^2-Ar-CX^3X^4-$).

A second aspect of the current invention comprises a method for preparing a porous dielectric thin film for fabricating integrated circuits ("IC"), wherein the dielectric thin film comprises a porous film having a dielectric constant equal to or less than 2.1. The steps involved in this method are initially transporting radical intermediates to a substrate in the presence of an un-reacted compound. Under preferred conditions, the substrate is kept at a temperature equal to or below a melting temperature of the radical intermediate ("$T^1_m$"). The transporting step is generally conducted within in a transporting-atmosphere, which comprises a vacuum with a low system leakage rate, an inert atmosphere, or both. The radical intermediates are then allowed to polymerize on the substrate forming an as-deposited-film. The as-deposited-film is then treated by a post-treatment process before removing the porous dielectric thin film from the transporting-atmosphere. The dielectric thin film in a preferred embodiment comprises a porous PPX film. However other preferred embodiments the dielectric thin film comprises a semicrystalline PPX film. In a specific embodiment, the method for preparing the porous dielectric thin film for fabricating integrated circuits ("IC") further comprises crystallizing the intermediates on the substrate either during or before the polymerizing step.

A third aspect of the invention is the post-treatment process of the method for preparing the porous dielectric thin film, the method comprising heating the as-deposited-film under a post-treatment-vacuum and introducing a reductive atmosphere (e.g. hydrogen in a noble gas) to give a heated-thin film. In specific embodiments, the reductive atmosphere comprises at least 0.1% hydrogen in an inert gas, such as argon. Alternatively, the reductive atmosphere comprises hydrogen in the presence of a silane compound. The post-treatment-vacuum comprises a vacuum with a low system leakage rate. Another step in the post-treatment process is heating the as-deposited-film at a temperature between 50° to 90° C. below a melting temperature of the as-deposited-film. The heated-thin film is then maintained at isothermal temperature for a period of time (e.g. about 1 to about 120 minutes) to give an isothermal-heated-thin film. In preferred embodiments, the isothermal-heated-thin film is then cooled to a cooling-temperature to give the dielectric thin film. The cooling rate is about 30° to about 100° C. per minute to a temperature that is about 20° to about 50° C. below a reversible crystal transformation temperature.

A fourth aspect of the current invention is a method of re-stabilizing an as-deposited etched-dielectric thin film that was subjected to a reactive-plasma-etching-process. The method of re-stabilizing the as deposited etched-dielectric thin film comprises treating the etched-dielectric thin film under an atmosphere with a non-reactive plasma to give a treated-etched-dielectric thin film. The treated-etched-dielectric thin film is then reductive-annealed under a reducing atmosphere at a temperature in the range between −50 to +50° C. of a reversible crystal transformation temperature to give a reduced-etched-dielectric thin film. The reduced-etched-dielectric thin film is maintained at an isothermal temperature for a predetermined period of time to give an isothermal-reduced-etched-dielectric thin film. The isothermal-reduced-etched-dielectric thin film is then cooled to a surface temperature that is at least 20° C. to 50° C. below a reversible crystal transformation temperature of the polymer film to give a re-stabilized-etched-dielectric thin film. In specific embodiments, the reactive-plasma-etching-process occurs under a reactive-atmosphere comprising nitrogen or oxygen. Additionally, the etched-dielectric thin film is treated with the non-reactive plasma in the presence of a noble gas (e.g. argon). The non-reactive plasma is performed at a discharge power of about 10 to 100 Watts for a time period between 2 to 50 minutes. Reductive annealing is performed in the presence of a reductive gas sufficient to reduce an oxygenated $sp^2C$ and $HC-sp^3C_\alpha$ bonds (HC represents a hyper-conjugated carbon) to $sp^2C-X$ and $HC-sp^3C_\alpha-X$, wherein X is H or F. The reductive gas comprises 1 to 10% hydrogen in argon; alternatively the reductive gas comprises 1 to 10% fluorine in argon.

DETAILED DESCRIPTION OF THE PREFERRED EMBODIMENTS

Figure 1:
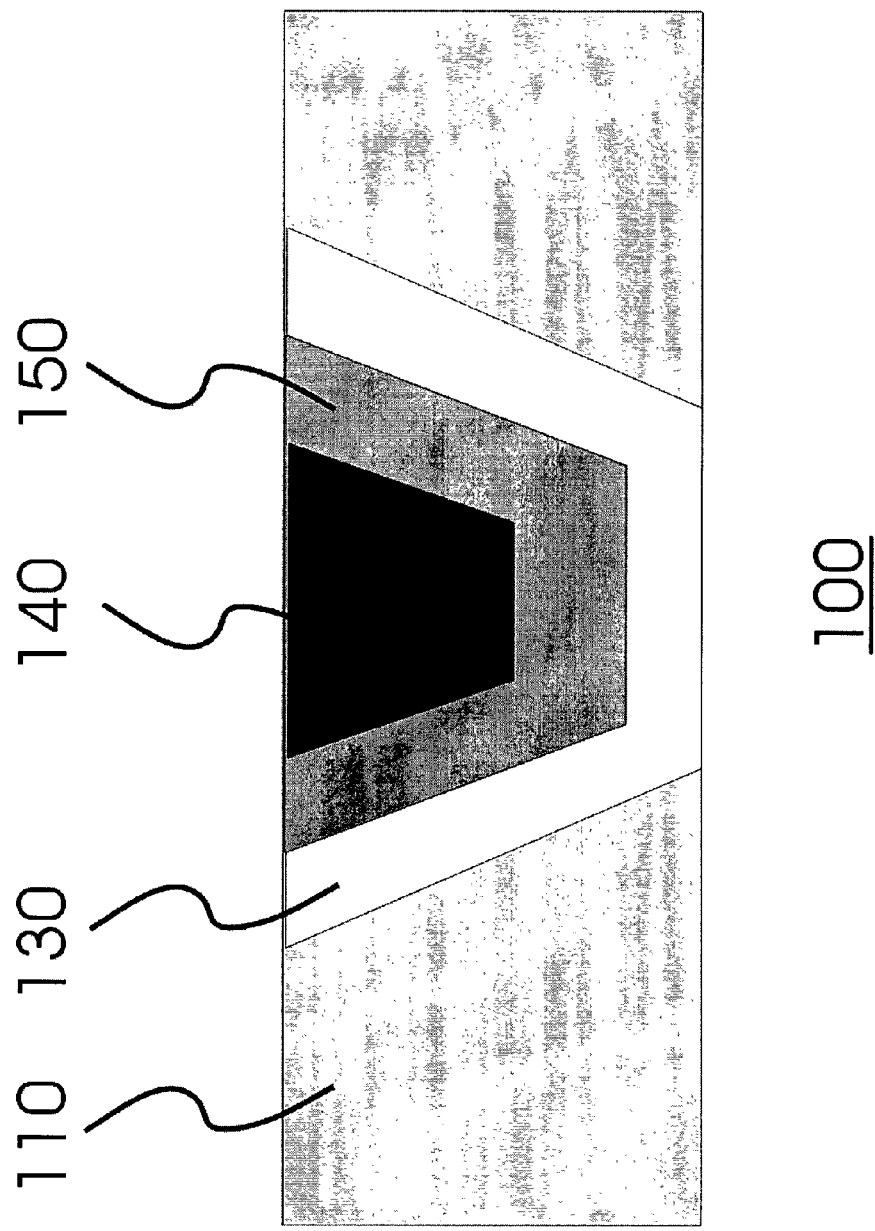
FIG. 1 shows an illustration of a single Damascene structure.

Terms:

The term "first-precursor" as used herein denotes a precursor that forms radical intermediate or intermediates during Homo-Transport Polymerization ("HTP").

The term "second-precursor" as used herein denotes a precursor that does not form radical intermediate or intermediates during the Homo-Transport Polymerization ("HTP"); the second precursor can be similar to, or different from, the first precursor. The term "un-reacted precursor" can also be used interchangeably.

The term "Homo-Transport Polymerization" ("HTP") as used herein comprises a method wherein a low k (<2.0) porous film is produced from a distinct precursor. The HTP method avoids the need of using a dissimilar precursor, as used in the method of co-polymerization.

The term "HTP-atmosphere" as used herein comprises the atmospheric conditions used during Homo-transport Polymerization ("HTP"). Generally, a HTP-atmosphere refers to a vacuum with a low system leakage rate, an inert atmosphere, or both. The term "transporting-atmosphere" can also be used interchangeably.

The term "inert atmosphere" as used herein comprises an atmosphere that is devoid of free radical scavengers such as water and oxygen, or devoid of a compound containing "active hydrogen," such as an —OH, —SH, or —RNH group.

The term "glass transition temperature" is abbreviated ("$T_g$").

The term "irreversible crystal transformation temperature" is abbreviated ("$T_1$").

The term "reversible crystal transformation temperature" is abbreviated ("$T_2$").

The term "melting temperature" for polymer is abbreviated ("$T_m$").

The term "maximum processing temperature" is abbreviated ("$T_{max}$").

The term "melting temperature" for intermediate is abbreviated ("$T^i_m$") or ("Tdm").

A primary aspect of this invention is to provide compositions and methods for making low k ($\leq 2.0$) porous film from a distinct precursor or homo-transport polymerization ("HTP"). This method can avoid the need of using dissimilar precursors, which wer used in the method of co-polymerization. Additionally, a porous dielectric film with small pore size and narrow pore size distribution is achieved using the method described in this invention. Furthermore, a dielectric film with high crystallinity and Young's Modulus with both chemical and electrical stability is also achieved with the method described for this invention. The porous dielectric films of this invention are suitable for fabrication of IC's using the Cu Dual Damascene process.

Broadly, the present invention pertains to a processing method to produce a porous polymer film that consists of $sp^2C$—X and $HC-sp^3C_\alpha$—X bonds (wherein, X=H or F), and exhibits at least a crystal melting temperature, ("$T_m$"). The porous polymer films produced by this invention are useful for fabricating future integrated circuits ("IC's"). The method described herein is useful for preparing the porous polymer films by polymerizing a radical intermediate (e.g. Ar(—$CF_2$-e)$_2$) with a low feed rate and at temperatures equal to or below a melting temperature of intermediate ($T^i_m$). Precursors that have not reacted or have incomplete conversion to intermediates are co-transported to a deposition chamber and become an inclusion of the deposited film. By utilizing a subsequent in-situ, post treatment process the inclusions in the deposited film can be removed to leave micro-pores in the resultant film (i.e. a porous polymer film). Annealing methods are used herein to stabilize the polymer films after reactive plasma etching. Furthermore, the present invention pertains to employment of reductive plasma conditions for patterning polymer films that consist of $sp^2C$—X and $HC-sp^3C_\alpha$—X bonds (wherein, X=H, F).

Accordingly, a first aspect of the current invention is a dielectric thin film prepared by homo-transport polymerization ("HTP") of radical intermediates in the presence of a un-reacted compound (i.e. a second-precursor). The radical intermediate has a general structure $(Ar(CX_2\text{-e})_{n^o})$ (II), wherein X is similar or different, and individually a hydrogen, a fluorine, an alkyl group, a fluorinated alkyl group, a phenyl group, or a fluorinated phenyl; Ar is an aromatic or a fluorinated-aromatic group moiety; $n^o$ comprises an integer of at least 2, but is less than total $sp^2$ carbons on the aromatic moiety; e comprises a free radical having an unpaired electron. In a preferred embodiment the radical intermediate has a general radical structure comprising $(Ar(CX_2\text{-e})_2)$ (III), wherein, X is similar or different, and individually a hydrogen, a fluorine, an alkyl group, a fluorinated alkyl group, a phenyl group, or a fluorinated phenyl; Ar is an aromatic or a fluorinated-aromatic group moiety; e comprises a free radical having an unpaired electron. The HTP of radical intermediates occurs inside a deposition chamber with a gas composition comprising the second-precursor in a concentration range of 0.001 to 25 molar percent. The HPT of radical intermediates is generally performed under an HPT-atmosphere, and the HTP-atmosphere comprises a vacuum with a low system leakage rate, an inert atmosphere, or both. In a specific embodiment the un-reacted compound is incorporated in the dielectric thin film. In another specific embodiment, the second precursor comprises the general structure $(Ar(CX_2\text{—Y})_{n^o})$ (I), wherein, Y is a leaving group comprising —COOR, $NR_2$, and halides, R is an alkyl group; X is similar or different, and individually a hydrogen, a fluorine, an alkyl group, a fluorinated alkyl group, a phenyl group, or a fluorinated phenyl; Ar is an aromatic or a fluorinated-aromatic group moiety; and $n^o$ comprises an integer of at least 2, but is less than total $sp^2$ carbons on the aromatic moiety. The first-precursor or second-precursor in a specific embodiment comprises Br—$CF_2$—$C_6H_4$—$F_2C$—Br or I—$CF_2$—$C_6H_4$—$F_2C$—I. In a further specific embodiment the aromatic moiety Ar of either the radical intermediate or the second-precursor is selected from a group consisting of $C_6H_{4-n}F_n$ (n=0 to 4), $C_{10}H_{6-n}F_n$ (n=0 to 6), $C_{12}H_{8-n}F_n$ (n=0 to 8), $C_{14}H_{8-n}F_n$ (n=0 to 8), $C_{16}H_{8-n}F_n$ (n=0 to 8), and $C_{16}H_{10}-nF_n$ (n=0 to 10). The dielectric thin film of this invention comprises a poly(para-xylylene) ("PPX") having a repeating unit selected from a group consisting of $CH_2$—$C_6H_4$—$H_2C$, $CF_2$—$C_6H_4$—$F_2C$, $CF_2$—$C_6F_4$—$F_2C$, $CH_2$—$C_6F_4$—$H_2C$, $CF_2$—$C_6H_2F_2$—$CF_2$, and $CF_2$—$C_6F_4$—$H_2C$.

A second aspect of the current invention comprises a method for preparing a porous dielectric thin film for fabricating integrated circuits ("IC"), wherein the dielectric thin film comprises a porous film having a dielectric constant equal to or less than 2.1. The steps involved in this method are initially transporting radical intermediates to a substrate in the presence of an un-reactive compound. Under preferred conditions, the substrate is kept at a temperature equal to or below a melting temperature of the radical intermediate ("$T^1_m$"). The transporting step is generally conducted within in a transporting-atmosphere, which comprises a vacuum with a low system leakage rate, an inert atmosphere, or both. The radical intermediates are then allowed to polymerize on the substrate forming an as-deposited-film. The as-deposited-film is then treated by a post-treatment process before removing the porous dielectric thin film from the transporting-atmosphere. The radical intermediate that is useful for this method has a general structure (III) comprising the formula $(Ar(CX_2\text{-e})_2)$, wherein, the X's are similar or different, and individually a hydrogen, a fluorine, an alkyl group, a fluorinated alkyl group, a phenyl group, or a fluorinated phenyl; Ar is an aromatic or a fluorinated-aromatic group moiety; e comprises a free radical having an unpaired electron. The aromatic moiety Ar of a radical intermediate is selected from the group consisting of $C_6H_{4-n}F_n$ (n=0 to 4), $C_{10}H_{6-n}F_n$ (n=0 to 6), $C_{12}H_{8-n}F_n$ (n=0 to 8), $C_{14}H_{8-n}F_n$ (n=0 to 8), $C_{16}H_{8-n}F_n$ (n=0 to 8), and $C_{16}H_{10}-nF_n$ (n=0 to 8) in specific embodiments. In a specific embodiment, the radical intermediate comprises a general structure of $(e\text{-}(CX_2\text{—}C_6H_{4-n}Z_n\text{—}X_2C)\text{-e})$ (IV), wherein, the X's are fluorine; Z is hydrogen or fluorine; e comprises a free radical having an unpaired electron; n is an integer between 0 and 4. Additionally, the un-reacted compound of this invention comprises a second-precursor having the structure of (Y—CX$_2$—C$_6$H$_{4-n}$Z$_n$—X$_2$C—Y); (V), wherein, Y is a Br or I; X is a fluorine; Z is hydrogen or fluorine; and n is an integer between 0 and 4. The dielectric thin film of this invention comprises a poly(paraxylylene) ("PPX") having a general structure of (—CX$_2$—C$_6$H$_{4-n}$Z$_n$—X$_2$C—)$_N$; (VI), wherein, X is hydrogen or fluorine; Z is hydrogen or fluorine; n is an integer between 0 and 4; and N is the number of repeating units, wherein N is greater than 10. In a preferred embodiment, N is a value greater than 50. The dielectric thin film in a preferred embodiment comprises a porous PPX film. However other preferred embodiments comprises a semicrystalline PPX film. The repeating unit structure of the PPX film comprises a structure of (—CF$_2$—C$_6$H$_4$—F$_2$C—). In a specific embodiment, the method for preparing the porous dielectric thin film for fabricating integrated circuits ("IC") further comprises crystallizing the intermediates on the substrate either during or after the polymerizing step.

A third aspect of the invention is the post-treatment process of the method for preparing the porous dielectric thin film comprising heating the as-deposited-film under a post-treatment-vacuum and introducing a reductive atmosphere (e.g. hydrogen in a noble gas) to give a heated-thin film. In specific embodiments, the reductive atmosphere comprises at least 0.1% hydrogen in argon. Alternatively, the reductive atmosphere comprises hydrogen in the presence of a silane compound comprising the general structure (X—SiR$_3$) wherein X is C═C, H or an amino (—NR$_2$) containing radical, and; the R's are similar or different and individually H, F or OCH$_3$. The post-treatment-vacuum comprises a vacuum with a low system leakage rate. Another step in the post-treatment process is heating the as-deposited-film at a temperature between 50° to 90° C. below a melting temperature of the as-deposited-film. The heated-thin film is then maintained at isothermal temperature for a period of time (e.g. about 1 to about 120 minutes) to give an isothermal-heated-thin film. In preferred embodiments, the isothermal-heated-thin film is then cooled to a cooling-temperature to give the dielectric thin film. The cooling rate is about 30° to about 100° C. per minute to a temperature that is about 20° to about 50° C. below a reversible crystal transformation temperature.

A fourth aspect of the current invention is a method of re-stabilizing an as-deposited etched-dielectric thin film that was subjected to a reactive-plasma-etching-process. The method of re-stabilizing the as deposited etched-dielectric thin film comprises treating the etched-dielectric thin film under an atmosphere with an non-reactive plasma. The non-reactive plasma depletes an oxygenated surface group of the as-deposited etched-dielectric thin film to give a treated-etched-dielectric thin film. The treated-etched-dielectric thin film is then reductive-annealed under a reducing atmosphere at a temperature in the range between −50 to +50° C. of a reversible crystal transformation temperature to give a reduced-etched-dielectric thin film. The reduced-etched-dielectric thin film is maintained at an isothermal temperature for a predetermined period of time to give an isothermal-reduced-etched-dielectric thin film. The isothermal-reduced-etched-dielectric thin film is then cooled to a surface temperature that is at least 20° C. to 50° C. below a reversible crystal transformation temperature of the polymer film to give a re-stabilized-etched-dielectric thin film. For the re-stabilizing method of an as-deposited etched-dielectric thin film, a melting temperature is greater than the reversible crystal transformation temperature, the reversible crystal transformation temperature is greater than an irreversible crystal transformation temperature, and the irreversible crystal transformation temperature is greater than a glass transition temperature for the etched-dielectric thin film. In specific embodiments, the reactive-plasma-etching-process occurs under a reactive-atmosphere comprising nitrogen or oxygen. Additionally, the etched-dielectric thin film is treated with the non-reactive plasma in the presence of a noble gas (e.g. argon). The non-reactive plasma is performed at a discharge power of about 10 to 100 Watts for a time period between 2 to 50 minutes. Reductive annealing is performed in the presence of a reductive gas sufficient to reduce an oxygenated sp$^2$C and HC-sp$^3$C bonds to sp$^2$C—X and HC-sp$^3$C$_\alpha$—X, wherein X is H or F. The reductive gas comprises 1 to 10% hydrogen in argon; alternatively the reductive gas comprises 1 to 10% fluorine in argon.

I. General Chemical Aspects of the Invention

The porous polymer films of this invention are preferably prepared by the process of Polymerization During Crystallization ("PDC") or Polymerization After Crystallization ("PAC") of intermediates with a general structural formula as shown in (II):

(II)

The intermediates of formula (II) can be polymerized on a substrate using a vacuum with a low system-leakage-rate, or an inert atmosphere or both. Wherein, "X"=H or preferably F. The ("Ar") is an aromatic moiety containing 6 to 30 carbons, and ("e") is a free radical having an unpaired electron. The ("n$^o$") is an integer of at least two, but less than the total available sp$^2$C in the aromatic moiety. A preferred method for preparing the polymer films by polymerizing a diradical intermediate (e.g. Ar(—CF$_2$-e)$_2$) with a low feed rate at temperatures equal to or below the melting temperature of the intermediate ("T$^1_m$"). Therefore, the substrate temperature is equal to or preferably lower than the T$^1_m$ of the intermediate during polymerization. The polymerization occurs during, or preferably after the crystallization of the intermediates on the substrate. The resultant polymer film has a melting temperature ("T$_m$").

It is important to note that the resultant polymer films have a low dielectric constant ("k") (e.g. <2.0), and the polymers comprise sp$^2$C—X and HC-sp$^3$C$_\alpha$—X bonds (wherein, X is H or F). The HC-sp$^3$C$_\alpha$—X is designated as a hyper-conjugated sp$^3$C—X bond, or for a single bond of X to a carbon that is bonded directly to an aromatic moiety. Although not wanting to be bound by theory, due to hyper-conjugation, the C—X (wherein, X=H or F) bond has some double-double bond character and is thermally stable, which is useful for fabrications of future ICs. The reactions occur in an inert atmosphere that is preferably devoid of free radical scavengers or compounds containing active hydrogen (e.g. H$_2$O and NH$_3$).

The intermediate of a preferred embodiment has the general structure as shown in structural formula III:

(III)

wherein, $X_1$, $X_2$, $X_3$, and $X_4$ are similar or different, and individually a hydrogen, a fluorine, an alkyl group, a fluorinated alkyl group, a phenyl group, or a fluorinated phenyl; Ar is an aromatic or a fluorinated-aromatic group moiety; e comprises a free radical having an unpaired electron. Examples of the aromatic moiety, Ar, include, but are not limited to, the phenyl moiety, $C_6H_{4-n}F_n$ (n=0 to 4), including $C_6H_4$ and $C_6F_4$; the naphthenyl moiety, $C_{10}H_{6-n}F_n$ (n=0 to 6), including $C_{10}H_6$ and $C_{10}F_6$; the di-phenyl moiety, $C_{12}H_{8-n}F_n$ (n=0 to 8), including $C_6H_2F_2$—$C_6H_2F_2$ and $C_6F_4$—$C_6H_4$; the anthracenyl moiety, $C_{12}H_{8-n}F_n$ (n=0 to 8); the phenanthrenyl moiety, $C_{14}H_{8-n}F_n$ (n=0 to 8); the pyrenyl moiety, $C_{16}H_{8-n}F_n$ (n=0 to 8) and more complex combinations of the above moieties, including $C_{16}H_{10}-nF_n$ (n=0 to 10). Isomers of various fluorine substitutions on the aromatic moieties are also included.

The polymer film comprises a fluorinated or un-fluorinated PPX film having a general structure of (—$CX_2$—$C_6H_{4-n}Z_n$—$X_2C$—$)_N$, wherein X=H or F, Z=H or F, n is an integer between 0 and 4, and N is the number of repeat units, greater than 10. Preferably, N is greater than 20 or 50 repeat units. In another embodiment, the PPX film comprises a transparent and semicrystalline film. In further specific embodiment, the PPX film comprises a PPX-F, which has a repeating unit with the structure of (—$CF_2$—$C_6H_4$—$F_2C$—).

A vacuum is utilized to avoid moisture inside deposition chamber, wherein the base vacuum is typically lower than 100 mTorrs, and preferably below 0.01 mTorrs. The system leakage rate is less than about 2 mTorrs per minute, and preferably less than 0.4 mTorrs/minute.

Although not wanting to be bound by theory, any material with low dielectric constant, such as a PPX film, has to possess several important attributes to be acceptable for integration into IC's. For example, the dielectric should be compositionally and dimensionally stable. The structural integrity should remain intact throughout the fabrication processes and after integration into the IC's. These processes include reactive ion etching ("RIE") or plasma patterning, stripping of photoresist, chemical vapor or physical vapor deposition ("CVD" or "PVD") of barrier and cap materials, electroplating and annealing of copper and chemical mechanical polishing ("CMP") of the copper. Although not wanting to be bound by theory, to maintain electrical integrity after the IC fabrication, the dielectric is free from contamination by barrier materials (e.g. Ta). Additionally, the dielectric should not cause the structural or chemical breakdown of a barrier or cap layer. No corrosive organic elements should diffuse into the barrier or cap material, in particular elements that would cause interfacial corrosion. The dielectric should have sufficient dimensional stability so that interfacial stress resulting from a Coefficient of Thermal Expansion ("CTE")-mismatch between the dielectric and barrier or cap layer would not induce structural failure during and after the manufacturing of the IC's. Finally, the interfaces of the dielectric and barrier or cap layers should be free from moisture, preventing the occurrence of ionic formation and/or migration when the IC's are operated under electrical bias.

PPX films are prepared by polymerization of their corresponding radical intermediates via transport polymerization. (Lee, J., Macromol, et al., Sci-Rev. Macromol. Chem., C16(1) (1977–78)). Examples of the PPX films and their repeat units resulting from polymerization of the radical intermediates include commercially available products, such as: PPX-N (—$CH_2$—$C_6H_4$—$CH_2$—); PPX-F (—$CF_2$—$C_6H_4$—$CF_2$—); and perfluoro PPX (—$CF_2$—$C_6F_4$—$CF_2$—).

In general, radical intermediates can be prepared from pyrolysis of corresponding dimers according to the Gorham method (U.S. Pat No. 3,342,754). They can also be prepared by pyrolysis of monomers and co-monomers (see U.S. patent application "Integration of Low $\epsilon$ Thin Film and Ta Into Cu Dual Damascene," Ser. No. 09/795,217, the entire content of which is hereby incorporated by reference) under vacuum conditions or an inert atmosphere. The vacuum should be lower than about 100 mTorrs, preferably about 30 mTorrs. The vacuum system should also have an air or system leakage rate of less than about 2 mTorrs/minute, preferably lower than 0.4 mTorrs/minute. An inert atmosphere is an atmosphere that is devoid of free radical scavengers such as water and oxygen, or devoid of a compound containing "active hydrogen," such as an —OH, —SH, or —RNH group.

The resultant PPX products can be transparent or opaque films or in powder form depending on processing conditions. Because only continuous films can be useful for IC manufacturing applications, opaque films that contain micro-cracks or spherulites with crystal sizes even in sub-micrometer range are not useful for this invention. Transparent films can be in an amorphous or semicrystalline PPX phase. The semicrystalline PPX films are typically useful for the manufacturing of future IC's when its crystalline phase is 10 nm or lower. Although not wanting to be bound by theory, amorphous PPX films consist of random polymer chain orientations that create equal interfacial stress in all directions, and avoid problems that are associated with semi-crystalline polymers. However, amorphous PPX films can be re-crystallized into semicrystalline films. For example, these amorphous PPX films with regular chemical structure or repeating unit in their backbone structures can transform into semicrystalline films when they are exposed to temperatures 20° to 30° C. above their glass transition temperature ("$T_g$"). Since re-crystallization will induce a dimensional change and PPX-N and PPX-F have $T_g$'s of only about 65° C. and 172° C. respectively, the amorphous or low crystalline PPX-N and PPX-F are not useful for the manufacturing of future IC's.

Transparent semicrystalline PPX-N films have been obtained by controlling primarily the substrate temperature and chemical feed rate under a particular range of vacuum pressure in a deposition chamber. Detailed conditions and general mechanisms for making transparent semicrystalline PPX-N films have been described previously (Wunderlich et al., J. Polym. Sci. Polym. Phys. Ed., Vol. 11 (1973) and Wunderlich et al., J. Polym. Sci. Polym. Phys. Ed., Vol. 13 (1975)). The suitable vacuum range is about 1 to about 100 mTorrs, preferably about 5 to about 25 mTorrs. Under this vacuum range, the crystal form and crystallinity are result directly from the feed rate and substrate temperature. Suitable substrate temperatures can range from about –10° C. to about –80° C., preferably from about –25 to about –45° C. During IC fabrication, wafer temperature is controlled by the cooling of an electric chuck or a wafer holder using a coolant. A wafer temperature below about −45° C. is desirable for obtaining a high deposition rate, but it requires a special, expensive coolant such as fluorocarbon fluid or silicone oil.

It should be noted that at very low substrate temperatures, about −50 to −60° C., nucleation rates can be very high and hetero-epitaxial or highly oriented crystal growth is possible. The resulting polymer crystals would therefore be in "transcyrstalline" or "columnar" forms. Although not wanting to be bound by theory, at low temperature ranges the radicals are absorbed very rapidly and the film growth rates are very high. However, this is achieved at the expense of the resulting crystallinity due to the entrapment of low molecular weight PPX-F units or other defects. A PPX-F film with low crystallinity can have poor dimensional stability at temperatures above its $T_g$, about 172° C. PPX-F films prepared under these conditions still need to be properly annealed before they can be useful for the manufacturing of future IC's. Although not wanting to be bound by theory, thin films consisting of even more than few percent of low molecular weight PPX-F polymers are not useful due to the poor dimensional and chemical stability during the manufacturing of IC's. Therefore, under the vacuum range of a few mTorrs and at substrate temperatures ranging from about −25 to about −45° C., desirable thin films with high crystallinity can be obtained by adjusting the feed rate of the precursors. Depending on the chemistries and precursors employed for the preparation, the feed rates can be very different. For example, at a feed rate from 1 to 10 standard cubic centimeters per minutes ("sccm") of the monomer $Br-CF_2-C_6H_4-CF_2-Br$ and at a substrate temperature from about −30 to about −50° C., crystalline PPX-F films can be obtained. Although not wanting to be bound by theory, when the substrate temperature is higher than about 10° to 20° C., nucleation is difficult due to the low adsorption of radical intermediates. However, under very high feed or flow rates, polymer crystal growth can still be possible after an induction period to overcome primary nucleation on the substrate. PPX-F films prepared under these conditions can have high crystallinity. Even without annealing, these PPX-F films can be useful for integration into future IC's. Furthermore, it is possible to prepare a high temperature crystal form of PPX-F at substrate temperatures above 40–60° C.

Methods for Preparing Porous Film from Homo-Polymerization:

The deposition processes described above inherently resulted in an as-deposited film with both chemical and dimensional instabilities that need further explanations, which are described in the following paragraphs. When a pinhole free polymer film is desired, a low temperature trap between the reactor and the deposition chamber is used to remove the residue precursors without removing much of the intermediates. Although not wanting to be bound by theory, the removal of residue precursors is possible because a precursor has a higher boiling temperature as a result of having higher molecular mass and is more polar than its corresponding intermediate. However, we found it is desirable to include an un-converted precursor (i.e. second-precursor) in the resulting polymer film then remove the inclusion in a subsequent in-situ post treatment to leave micro-pores in the resultant film. The resulting porous film has lower dielectric constant than its corresponding pinhole free film. Additionally, the degree of porosity of the resulting film is proportional to the amounts of un-reacted precursor (i.e. second-precursor) inclusion in the film. The amount of precursor inclusion in the resulted film can be measured by monitoring the load lock chamber pressure increases after the wafer is exposed to an IR and after the wafer temperature approaches the boiling temperature of the precursor under vacuum. In this invention, between about 5% to about 25%, preferably about 10% of the second-precursor inclusion is allowed.

Accordingly, the "un-reacted precursor" or "second-precursor" or precursor that does not form radical intermediate can be introduced by changing the reactor conditions, if only one precursor source and a vapor phase controller is employed in the processing chamber. One should note that if the reactor conditions are changed to reduce the degree of conversion to less than 100%, then some first-precursor molecules may have only one of its two leaving groups removed, and a "chain-terminating" mono-radical will be generated. Although not wanting to be bound by theory, the chain-terminating mono-radical will result in polymer chain termination, because it can not be further polymerized to extend the polymer chain growth. Thus, the chain-terminating mono-radical will result in lower molecular weight films with poor mechanical properties, which is undesirable. Alternatively, the "un-reacted" or "second-precursors" are preferably introduced into the deposition chamber directly via a second path and a separate vapor flow controller ("VFC") for controlling the desirable amounts of the un-reacted or second precursors.

Chemical Instability of as-Deposited Films:

In general, the dielectric film of this invention is formed in vacuum by step polymerization of many intermediate molecules or intermediates called radicals. Each radical carries an unpaired electron on both ends of the intermediate. The radical is called an intermediate, because it is very reactive toward another radical. It has a lifetime in $10^{-6}$ seconds or less, when colliding at solid state with another radical, even at temperatures as low as −100° C. The reaction for polymer-chain extension is called "step polymerization" because the polymerization reaction occurring one step at a time. Although not wanting to be bound by theory, each radical can grow from both ends of the intermediate after each step of the reaction, and the added polymer always leaves another unpaired electron at the polymer chain end. Thus, as polymer chain grows, each polymer-chain always bears two unpaired electrons at both ends of the polymer. This polymer chain is alive and can grow further as long as there is no scavenger around or physically the chain-end is buried under other polymer chains that grow over the end. A compound that consists of X—H (wherein, X is nitrogen, sulfur and oxygen) or an oxygen group is very effective toward the unpaired electron, and are called scavengers capable of stopping the chain growth.

Although not wanting to be bound by theory, since scavengers are absence under vacuum, the resulting dielectric film comprises living polymers or polymer with unpaired electron at polymer chain ends. Although the polymer chain ends are buried inside the films, they are still reactive toward scavengers. Additionally, most scavengers have smaller molecular size and can still diffuse to these chain ends. The resulting products that carrying —C=O or C—X (X=O, N, S) bonds, are very thermally unstable at high temperatures, because these chemical groups decompose at temperatures from 250° C. to 400° C. in few minutes. Thus, the presence of these unpaired electrons at polymer chain ends can result in poor electrical properties. Consequently, the above problems pose challenges to making chemically and electrically stable dielectric films if the as-deposited film is exposed to air before these living chain ends are converted to some stable chemical groups. However, one solution for this problem is to anneal an as-deposited dielectric film with hydrogen under high temperature before the film is removed from deposition chamber or vacuum system. Although not wanting to be bound by theory, this annealing process can achieve both high crystallinity for better dimensional stability and chemical stability by capping all unpaired chain ends with C—H bond, which is more stable than C—C or C—O bonds.

Accordingly, the method to achieve both dimensional and chemical stability for a useful porous film of this invention includes reductive-annealing of an as-deposited polymer film under a high temperature and preferably before its removal from the vacuum system. The reductive annealing is conducted under the presence of hydrogen, for instance from 0.1 to 100%, preferably 3 to 6% of hydrogen in an inert gas, preferably a noble gas such as Helium. The above annealing temperature ranges 50° C. to 90° C. below the melting temperature of the polymer film ("$T_m$"). After reaching the upper annealing temperature, the film is kept isothermally for about 1 to about 120 minutes, then cooling the sample at a rate greater than 30° C./minute, to a temperature ranging from 40° C. to 70° C. below the $T_m$. Preferably, the sample is held isothermally for between 2 and 60 minutes and is cooled at a rate of 50° to 100° C./minute. In a further preferred embodiment, the polymer film is stabilized by annealing the film at a temperature equal to or higher than the maximum temperature that the polymer will encounter during fabrication of IC's, for 10 to 60 minutes, and preferably 30 to 60 minutes. The annealing process is preferably conducted under an inert or non-reactive atmosphere. The in-situ post annealing process can achieve several objectives: To remove precursor inclusions and form pores; to end-cap the reactive chain ends that chemically stabilize the polymer chains; and to increase the crystallinity of the resulting film, which increases the physical properties such as the melting temperature and the Young's Modulus of the resulting porous film. Additional processes are used to retain the chemical and dimensional stability of the porous films after dry etching of this film.

Dimensional Instability of "as-Deposited" Films:

Although not wanting to be bound by theory, adhesion strength can be examined by looking into the chemical and physical contributors. One of the important requirements for the dielectric film is to achieve good adhesion to the barrier layer, etch stop layer and the cap layer. For example, good physical or mechanical adhesion requires good mechanical interlocks with larger contacting surfaces. In addition, to achieve good mechanical interlocking, the dimensional stability of the interlocking faces must be stable in view of their relative dimensional expansion under temperature incursion. Because all inorganic layers used in IC fabrications have lower Coefficient of Thermal Expansion ("CTE") than polymer dielectric, it is desirable to lower the CTE of the polymer dielectric by either increasing their cross-linking density or increasing their crystallinity.

In the present invention, dimensional stability of an as-deposited film is achieved by: 1) controlling the deposition conditions, such as feed rate and substrate temperature to obtain a thermally more stable crystal form; and 2) by post-annealing treatment of an as-deposited film to increase its crystallinity. The details for both the processing conditions and the post annealing methods are described in the following paragraphs.

II. Methods for Making Dimensional Stable Films

Although not wanting to be bound by theory, without proper processing conditions, high crystalline PPX films obtained through re-crystallization will fail when subjected to fabrication processes currently employed for making IC's. For example, in the IC's that use electrically plated copper as a conductor, the required annealing temperature for the copper ranges from 300° C. for one hour to 350° C. for 30 minutes. Some integration processes also require a substrate temperature of 400° C. In addition, wire bonding or solder reflow that occurs during packaging operations of the IC's require structural stability of the dielectric at temperatures as high as 300° to 350° C. Therefore, any useful PPX film needs to be chemical and dimensionally stable at temperatures up to 300° to 350° C., preferably 350° to 400° C. for at least 30 minutes.

DSC measurements for a PPX-F that were performed at a 10 to 15° C. per minute heating rate and under a nitrogen atmosphere showed that a peak $T_g$ was around 170° C. Additionally, an Alpha to Beta-1 irreversible crystal transformation temperature, ("ICT") was in a range from 200° C. to 290° C. with a peak temperature, $T_1$, around 280° C. The Beta-1 to Beta-2 reversible crystal transformation temperature ("RCT"), ranging from 350° C. to 400° C. with a peak $T_2$ around 396° C. and a melting temperature ("$T_m$") ranging from 495° C. to 512° C. with a peak $T_m$ around 500° C.

For comparison, the corresponding values in a PPX-N for the $T_g$, $T_1$, $T_2$, and $T_m$ are 65° C., 230° C., 292° and 430° C. respectively (Wunderlich et al., J. Polym. Sci. Polym. Phys. Ed., Vol. 11 (1973) and Wunderlich et al., J. Polym. Sci. Polym. Phys. Ed., Vol. 13 (1975)). The Alpha to Beta-1 crystal transformation occurring at $T_1$ is irreversible, while the Beta-1 to Beta-2 crystal transformation, at $T_2$, is reversible for both PPX-N and PPX-F. When a crystalline PPX-N or PPX-F film is exposed to temperatures approaching its $T_1$, polymer chains in its Alpha crystalline phase will start to reorganize and transform into a more thermally stable Beta-1 crystal phase. Once this occurs, the film will never show its Alpha phase again, even by cooling the film below its $T_1$. However, if a PPX-N or PPX-F film is cooled slowly from at or above its $T_2$ to a temperature below its $T_2$, the less dimensionally stable Beta-1 crystal phase will reform.

Although not wanting to be bound by theory, if the film is to be used or exposed to temperatures approaching $T_2$, one way to maximize the dimensional stability of the PPX-N or PPX-F film is to trap the polymer chains in their most thermally stable form, the Beta-2 crystal phase. Consequently, if the film is then exposed to temperatures approaching or surpassing its $T_2$ the crystal transformation cannot occur because the film is already in its Beta-2 form. Although not wanting to be bound by theory, eliminating this phase transformation ensures the dimensional stability of the film, and when the film is in its Beta-2 crystal phase, the dimensional stability is still assured even at temperatures approach 50° C. to 60° C. below the $T_m$. A highly crystalline (i.e. greater than 50% crystallinity) PPX-F film in a Beta-2 crystal phase can be dimensionally stable up to 450° C. for at least 30 minutes, limited only by its chemical stability.

A polymer film that exhibits a reversible crystal transformation temperature, $T_2$, and a crystal melting temperature, $T_m$ can be obtained by optimizing the feed rate and substrate temperature during film deposition. By controlling the feed rate and substrate temperatures, semicrystalline films consisting of either Alpha or Beta phase crystals have been prepared (Wunderlich et al., J. Polym. Sci. Polym. Phys. Ed., Vol. 11 (1973) and Wunderlich et al., J. Polym. Sci. Polym.

Phys. Ed., Vol. 13 (1975)). When the substrate temperature is lower than the melting temperature of the intermediate radical ("Tdm"), and when the feed rate is low (e.g. less than 0.07 g/minute), the polymerization of crystalline radicals can result in PPX-N films that are predominantly in the Beta crystal phase and have high crystallinity. Conversely, when the substrate temperature is higher than the Tdm, polymerization of liquid radicals and subsequent crystallization of polymers often results in PPX-N films that are in the Alpha crystal phase and have low crystallinity. Hence, when the above film is deposited on a wafer, the film is generally referred to as an "as-deposited film." In a preferred embodiment, before the as-deposited film is removed from the deposition system and when it is still under the vacuum condition, the as-deposited film needs to be further stabilized in order to achieve its chemical and dimensional stability useful for this invention.

Accordingly, a stabilized film can be obtained by annealing the as-deposited film to a temperature approaching to or above its $T_2$ and under the presence of hydrogen and then quickly quenching the films to at least 30° to 60° C. below their $T_2$. For instance, a PPX-F film that is predominantly in the Beta-2 crystal phase can be obtained by heating the film to 450° C. for 5 minutes, then quenching the film to 330° C. at a cooling rate of 50° C./minute. When the post annealing was performed under 3 to 20% hydrogen conditions, the resulting films also exhibited very low leakage current comparing to the as-deposited film and a annealed film that was obtained under vacuum conditions.

Actual polymer chain motions for solid state transition or phase transformation can start from 30° to 60° C. below the corresponding $T_g$, $T_1$, $T_2$ and $T_m$ depending on the history of the films, degree of crystallinity, perfection of crystals, or the existence of various low molecular weight material in the crystalline phase (Wunderlich, Macromolecular Physics, Vol. 1–2 (1976). In fact, the Beta-1 to Beta-2 transition can start at temperatures ranging from 40° C. to 50° C. below $T_2$, (about 396° C.) for PPX-F films. Therefore, by exposing an as-deposited PPX-F film to 350° C. for one hour, the quenched PPX-F film also exhibited a high content of Beta-2 phase crystallinity. The presence of Beta-2 crystals are verified by DSC. When a PPX-F film containing a high percentage of Beta-2 phase crystals was scanned by DSC from 25° C. to 510° C. under a nitrogen atmosphere, only $T_m$ was observed and not $T_1$ or $T_2$.

Although not wanting to be bound by theory, the maximum temperature ("$T_{max}$") that is encountered during the manufacturing of IC's, will undoubtedly be lowered over time due to technological advancements. Improvements in copper plating chemistries and the perfection of the resulting copper films will also lower the required annealing temperatures. In addition, physical vapor deposition temperatures for barrier layers or cap layers could be reduced to temperatures below 400° C. Consequently, once this occurs, the maximum processing temperature ("$T_{max}$") can be lowered to temperatures below 350° C., possibly as low as 325° to 300° C. In such a case, the annealing of PPX-F films can be performed at temperatures 30° C. to 50° C. below $T_2$ (e.g. 396° C. for PPX-F) or as low as temperatures 10° to 20° C. above $T_1$ (e.g. 280° C. for PPX-F). However, the annealing should be done at a temperature equal to or higher than the $T_{max}$ for 1 to 60 minutes and preferably for 3 to 5 minutes. The above post annealing processes should be conducted before the as-deposited film is removed from the deposition systems, and should be conducted in the presence of hydrogen. Preferably, the reductive annealing is conducted not inside the deposition chamber but inside a post treatment chamber. The reductive annealing is conducted under an atmosphere consisting of 0.1 to 100, preferably 3 to 6% of H in argon and at high temperatures conditions described in the above.

III. Methods for Stabilizing Films After Plasma Etching

During fabrication of future IC's, a stabilized film obtained from this invention will be subjected to further processes. For example, a photoresist is spun onto a substrate and patterned using a photo mask and UV irradiation. After removal of unexposed photoresist, a via pattern of photoresist remains over the underlying dielectric. The via is formed in the dielectric layer by subsequent plasma etching of the dielectric that is not protected by the photoresist. A thin layer (100 Å to 200 Å) of barrier metal such as Ta is then deposited using a physical vapor deposition ("PVD") method. Optionally, a cap-layer is deposited over the dielectric before coating of photoresist and photolithographic patterning of the dielectric. The cap-layer is used to protect the dielectric from mechnical damage during CMP.

The low k (<2.0) films that consist primarily of C, H and F and single bonds of $sp^2C$—F and HC-$sp^3C$—F types utilize oxidative plasma to achieve high etching rate vs. that of a photoresist. Treatment under 0.02 W/cm$^2$ to 2.0 W/cm$^2$, preferably 0.04 W/cm$^2$ to 1.0 W/cm$^2$ of discharge power and under 20 mTorrs to 2000 mTorrs, preferably 50 mTorrs to 500 mTorrs of oxygen pressure, an etching rate ranging from 500 to 5000 Å/minute can be obtained. However, the composition of the resulting surface became highly oxidized when more than a few Angstroms of polymers were removed from the film surface. Although not wanting to be bound by theory, the freshly etched polymer surfaces are NOT suitable for fabrication of IC's, because they consist of thermally unstable oxygenated carbon groups, such as —CX—O, —XC═O, —CX—O—O—X and —(C═O)—OX bonds (X═H or F), and these oxygenated carbon bonds will decompose at temperatures above 200 to 350° C. In addition, these types of oxidized surfaces tend to adsorb moisture and form hydrogen bonded water on their surfaces. Consequently, if a barrier metal, cap layer or etch stop layer is deposited over the oxidative plasma treated surface, loss of adhesion can easily happen after the coating process or during subsequent processes.

Patterning of the dielectric film of this invention has also been performed by dry etching using nitrogen plasma. For example, nitrogen plasma patterning can be done using 30W of plasma power under 900 mTorrs of pressure. The resultant film surfaces were found unsuitable for obtaining good adhesion. Although not wanting to be bound by theory, some nitrogen may have chemically reacted with the C—X (X═H or F) of the dielectric surfaces and converted to unstable —C—N or polar —C═N— bonds both are not desirable for IC fabrication applications.

A method to re-stabilize the reactive plasma etched treated polymer surfaces that are obtained from the oxygen or nitrogen plasma etching and need further coating includes a reductive annealing of the surfaces under hydrogen atmosphere at high temperatures. Alternatively, by treating the oxidized surfaces first using non-reactive plasma then followed with a reductive annealing at high temperatures, wherein the non-reactive plasma can be conducted in the presence of argon gas. Although not wanting to be bound by theory, in addition to removing some of the oxygenated or nitrogen-reacted carbon groups on surfaces, the non-reactive plasma is believed to also roughen these surfaces for better mechanical adhesion during the subsequent coating steps. The reductive annealing under high temperature is primarily used to reduce the $sp^2C$—Y and $HC$-$sp^3C$—Y (Y=O or N) groups back to $sp^2C$—X and $HC$-$sp^3C_\alpha$—X, (wherein X is F, or preferably H). The above methods result in thermally stable $sp^2C$—X and $HC$-$sp^3C_\alpha$—X bonds (wherein X=H or F) that are thermally stable for fabrications of future IC's. Other reactive chemicals (e.g. Silanes (C=C—$SiR^1R^2R^3$ and H—$SR^1R^2R^3$, wherein the R's are individually selected from H, F or $CH_3$)), and can also be used instead of hydrogen for successful reductive-annealing. The reductive-annealing can be conducted in an atmosphere comprising 1% to 30%, preferably 3% to 10% of hydrogen in argon or other noble gases and at 410° C. to 450° C. for 2 to 60, preferably from 3 to 10 minutes. The non-reactive plasma treatment can be conducted under treatment under 0.01 $W/cm^2$ to 1.0 $W/cm^2$, preferably 0.04 $W/cm^2$ to 0.4 $W/cm^2$ of discharge power and under 20 to 2000, preferably 50 to 500 mTorrs of argon pressure. Alternatively, the dry etching by plasma partnering of a polymer film can be conducted in the presence of an reductive gas composition, for instance, from 20 to 2000, preferably 100 to 1000 mTorrs of 3 to 10% of hydrogen in argon or other noble gases and under 0.01 $W/cm^2$ to 1.0 $W/cm^2$, preferably 0.04 $W/cm^2$ to 0.4 $W/cm^2$ of discharge power.

The above re-stabilization methods are not useful if the original low k (<2.0) films consist of other unstable chemical bonds, such as $sp^3C$—X bonds (X=H or F). These polymers consist of regular tetrahedron $sp^3C$—X bonds, such as —$CX_3$ and —$CX_2$— bonds (wherein, X=H or F) that its carbon is not an Alpha carbon to an aromatic moiety. Although not wanting to be bound by theory, these $sp^3C$—X bonds-containing polymers are not stable enough for fabrications of future IC's that require a minimum thermal stability at temperatures ≧350° C. for ≧30 minutes. Therefore, even if after-oxidative-plasma-etched surfaces are treated with the methods described above for this invention, the thermal stability of their resulting polymers will NOT be improved beyond the thermal stability of the original polymers, and will still not useful for fabrication of future IC's.

While the present invention has been particularly described, in conjunction with specific preferred embodiments, it is evident that many alternatives, modifications and variations will be apparent to those skilled in the art in light of the foregoing description. It is therefore contemplated that the appended claims will embrace any such alternatives, modifications, and variations as falling within the true scope and spirit of the present invention.

REFERENCES CITED

The following patents, patent applications, documents, and publications are incorporated by reference herein.

U.S. PATENT DOCUMENTS

U.S. Pat. No. 3,342,754 issued in September of 1967 with Gorham listed as inventor.
U.S. Pat. No. 6,302,874 issued in October of 2001 with Zhang et al. listed as inventors.
U.S. patent application Ser. No. 09/795,217; filed Feb. 26, 2001
U.S. patent application Ser. No. 09/925,712 filed on Aug. 9, 2001 and entitled "Stabilized Polymer Film & Its Manufacture" with Lee, et al. listed as inventors.
U.S. patent application Ser. No. 10/029,373 filed on Dec. 19, 2001 and entitled "Dieletric Thin films from Fluorinated Benzocybutane Precursors" with Lee, et al. listed as inventors.
U.S. patent application Ser. No. 10/028,198 filed in Dec. 19, 2001 and entitled "Dielectric Thin films from Fluorinated Precursors" with Lee, et al. listed as inventors.
U.S. patent application Ser. No. 10/116,724, filed on Apr. 4, 2002, and entitled "Chemically and Electrically stabilized Polymer Films" with Lee, et al. listed as inventors.
U.S. patent application Ser. No. 10/115,879 filed in Apr. 4, 2002, and entitled "UV Reactor for Transport polymerization" with Lee, et al. listed as inventors.
U.S. patent application Ser. No. 10/125,626 filed in Apr. 17, 2002, and entitled "Multi-stage-heating Thermal reactor for transport Polymerization" with Lee, et al. listed as inventors.
U.S. patent application Ser. No. 10/126,919 filed in Apr. 19, 2002 entitled "Process Modules for transport polymerization of low ϵ thin films" with Lee, et al. listed as inventors.
U.S. patent application Ser. No. 10,141,358 filed on May 9, 2002, and entitled "Thermal reactor for transport Polymerization of low k thin film" with Lee, et al. listed as inventors.

OTHER REFERENCES

Brun A. E. 100 nm: The Undiscovered Country, Semiconductor International, p 79, February 2000.
Chung Lee, "Transport Polymerization of Gaseous Intermediates and Polymer Crystals Growth" J. Macromol. Sci-Rev. Macromol. Chem., C16 (1), 79–127 (1977–78), pp 79–127).
Geissman T. A. Principles of Organic Chemistry, 3rd edition, W. H. Freeman & Company, p 275
Kudo et al., Proc. 3d Int. DUMIC Conference, 85–92 1997
LaBelle et al., Proc, 3d Int. DUMIC Conference, 98–105 1997
Lee, J., et al. Macromol Sci-Rev. Macromol. Chem., C16(1) 1977–78.
Lu et al, J. Mater. Res. Vol, 14(1), p 246–250, 1999; Plano et al, MRS Symp. Proc. Vol. 476, p 213–218, 1998
Selbrede, et al., Characterization of Parylene-N Thin Films for Low Dielectric Constant VLSI Applications, Feb. 10–11, 1997, DUMIC Conferece, 1997 ISMIC—222D/97/0034, 121–124.
Wang, et al., Parylene-N Thermal Stability Increase by oxygen Reduction-Low Substrate Temperature Deposition, Preannealing, and PETEOS Encapsulation, Feb. 10–11, 1997, DUMIC Conference, 1997 ISMIC—222D/97/0034, 125–128.
Wary, et al., Polymer Developed to be Interlayer Dielectric, Semi-Conductor International, 211–216, June 1996.
Wunderlich et al, Jour. Polymer. Sci. Polymer. Phys. Ed., Vol. 11, (1973), pp 2403–2411; ibid, Vol. 13, (1975), pp 1925–1938.
Wunderlich et al., J. Polym. Sci. Polym. Phys. Ed., Vol. 13 1975.
Wunderlich, Macromolecular Physics, Vol. 1–2, 1976.

What is claimed is:

1. A dielectric thin film prepared on a substrate, the dielectric thin film comprising:
a polymer material formed by homo-transport polymerization ("HTP") of radical intermediates, the radical intermediates being formed from a first precursor, and the radical intermediates having a general structure (II):

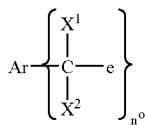

wherein:
X¹ and X² are similar or different, and individually a hydrogen, a fluorine, an alkyl group, a fluorinated alkyl group, a phenyl group, or a fluorinated phenyl;
Ar is an aromatic or a fluorinated-aromatic group moiety;
$n^o$ comprises an integer of at least 2, but is less than total $sp^2$ carbons on the aromatic moiety; and
e comprises a free radical having an unpaired electron; and
a second precursor incorporated into the polymer material, wherein the second precursor is removable from the dielectric film to create a porous dielectric film, wherein the second precursor comprises a general structure of (I):

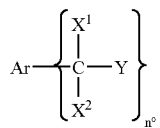

wherein each Y is a leaving group selected from —COOR, NR₂, and halides, wherein R is an alkyl group.

2. The dielectric thin film of claim 1, wherein the dielectric film is deposited under an HTP-atmosphere comprising a vacuum with a low system leakage rate, an inert atmosphere, or both.

3. The dielectric thin film of claim 1, wherein the HTP of radical intermediates occurs inside a deposition chamber with a gas composition comprising the second precursor in a concentration range of 0.001 to 25 molar percent.

4. The dielectric thin film of claim 3, wherein the radical intermediates are introduced into the deposition chamber via a first-path and the second precursor is introduced into the deposition chamber via a second-path with a separate vapor flow controller ("VFC").

5. The dielectric thin film of claim 1, wherein an amount of the second precursor incorporated into the dielectric thin film comprises about 5 to about 25 molar %.

6. The dielectric thin film of claim 1, wherein $n^o$ equals 2, and the radical intermediate has a general structure of (III):

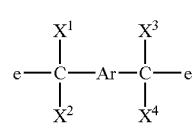

wherein,
X¹, X², X³, and X⁴ are similar or different, and individually a hydrogen, a fluorine, an alkyl group, a fluorinated alkyl group, a phenyl group, or a fluorinated phenyl.

7. The dielectric thin film of claim 1, wherein the aromatic moiety Ar is selected from a group consisting of $C_6H_{4-n}F_n$ (n=0 to 4), $C_{10}H_{6-n}F_n$ (n=0 to 6), $C_{12}H_{8-n}F_n$ (n=0 to 8), $C_{14}H_{8-n}F_n$ (n=0 to 8), $C_{16}H_{8-n}F_n$ (n=0 to 8), and $C_{16}H_{10-n}F_n$ (n=0 to 10).

8. The dielectric thin film of claim 1, wherein the dielectric thin film is poly (para-xylylene) ("PPX") having a repeating unit selected from a group consisting of $CH_2$—$C_6H_4$—$H_2C$, $CF_2$—$C_6H_4$—$F_2C$, $CF_2$—$C_6F_4$—$F_2C$, $CH_2$—$C_6F_4$—$H_2C$, $CF_2$—$C_6H_2F_2$—$CF_2$, and $CF_2$—$C_6F_4$—$H_2C$.

9. The dielectric thin film of claim 8, wherein the PPX film comprises PPX-F, having a repeating unit comprising ($CF_2$—$C_6H_4$—$F_2C$).

10. The dielectric thin film of claim 1, wherein the first precursor and the second precursor comprise Br—$CF_2$—$C_6H_4$—$F_2C$—Br.

11. The dielectric thin film of claim 1, wherein the first precursor and the second precursor comprise I—$CF_2$—$C_6H_4$—$F_2C$—I.

* * * * *